(12) United States Patent
Shimada

(10) Patent No.: US 9,187,844 B2
(45) Date of Patent: Nov. 17, 2015

(54) SINGLE CRYSTAL MANUFACTURING APPARATUS

(75) Inventor: Toshiro Shimada, Nishishirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 56 days.

(21) Appl. No.: 13/502,424

(22) PCT Filed: Dec. 3, 2010

(86) PCT No.: PCT/JP2010/007044
§ 371 (c)(1),
(2), (4) Date: Apr. 17, 2012

(87) PCT Pub. No.: WO2011/083529
PCT Pub. Date: Jul. 14, 2011

(65) Prior Publication Data
US 2012/0204784 A1   Aug. 16, 2012

(30) Foreign Application Priority Data
Jan. 8, 2010   (JP) .................................. 2010-002449

(51) Int. Cl.
*C30B 15/14*   (2006.01)
*C30B 29/06*   (2006.01)

(52) U.S. Cl.
CPC .................. *C30B 15/14* (2013.01); *C30B 29/06* (2013.01); *Y10T 117/1068* (2015.01)

(58) Field of Classification Search
CPC ............................... C30B 15/14; C30B 29/06
USPC .......... 117/217, 202, 200, 201, 204, 206, 223
See application file for complete search history.

(56) References Cited

U.S. PATENT DOCUMENTS

| 5,766,346 | A | * | 6/1998 | Hayashi et al. ............... 117/208 |
| 5,843,228 | A | | 12/1998 | Saitoh et al. |
| 5,968,266 | A | | 10/1999 | Iino et al. |

FOREIGN PATENT DOCUMENTS

| CN | 1168931 A | 12/1997 |
| CN | 101581542 A | 11/2009 |

(Continued)

OTHER PUBLICATIONS

International Search Report issued in International Patent Application No. PCT/JP2010/007044 dated Jan. 25, 2011.

(Continued)

*Primary Examiner* — Michael Kornakov
*Assistant Examiner* — Hua Qi
(74) *Attorney, Agent, or Firm* — Oliff PLC

(57) ABSTRACT

A single-crystal manufacturing apparatus for manufacturing a single crystal ingot according to the Czochralski method including: a crucible that contains a raw material melt; a heater having a cylindrical heat generating portion that surrounds the crucible; a main chamber that accommodates the heater; a heater electrode that supports the heater and supplies current to the heater; and a heat insulating plate provided below the cylindrical heat generating portion of the heater, wherein the heat insulating plate is fixed to and supported by the heater electrode through an insulating stationary member, and an insulating support member is provided on an upper surface of the heat insulating plate at a position at which the insulating support member faces a lower end of the cylindrical heat generating portion. Provided is a single-crystal manufacturing apparatus that can inhibit heater deformation and prevent deterioration of heat efficiency.

2 Claims, 4 Drawing Sheets

(56) References Cited

FOREIGN PATENT DOCUMENTS

| | | | | |
|---|---|---|---|---|
| JP | A-9-263491 | | 10/1997 | |
| JP | 10167876 A | * | 6/1998 | ............ C30B 15/00 |
| JP | A-10-167876 | | 6/1998 | |
| JP | 2000001394 A | * | 1/2000 | ............ C30B 29/06 |
| JP | A-2000-1394 | | 1/2000 | |
| JP | 2002137997 A | * | 5/2002 | |
| JP | A-2002-137997 | | 5/2002 | |
| JP | A-2009-274925 | | 11/2009 | |

OTHER PUBLICATIONS

Jul. 8, 2014 Office Action issued in Chinese Patent Application No. 201080053719.1 (with partial translation).

Jan. 30, 2015 Office Action issued in Chinese Patent Application No. 201080053719.1.

May 15, 2015 Office Action issued in Chinese Patent Application No. 201080053719.1.

* cited by examiner (a)

(b)

(a)

(b)

SINGLE CRYSTAL MANUFACTURING APPARATUS

TECHNICAL FIELD

The present invention relates to a single-crystal manufacturing apparatus for growing a single crystal ingot by using the Czochralski method.

BACKGROUND ART

As substrates for use in fabrication of very highly integrated semiconductor devices, mirror-polished silicon wafers are mainly used. These silicon wafers are produced by growing a silicon single crystal ingot according to the CZ method (the Czochralski method) and machining the grown single crystal ingot into wafers. In single crystal manufacture by the CZ method, the increasing size of apparatus and its furnace parts has been brought about by the increasing diameter of silicon wafers to reduce fabrication cost of semiconductor devices.

In the CZ method, a polycrystalline raw material charged in a quartz crucible is heated with a cylindrical graphite heater, and a single crystal is grown from the resulting silicon melt. The increasing size of crucibles and the like accompanying the increasing diameter of single crystal ingots being grown as above has increased also the size of heaters that surround and heat the crucibles. This makes a problem in that an electric discharge occurs due to contact with other components caused by heater deformation such as deflection. The weight of a larger heater may cause the deformation. Particularly, in the MCZ method (the magnetic field applied Czochralski method), Lorentz force in a magnetic field may also cause the deformation, and this cannot be ignored. To prevent the heater deformation, a method of providing auxiliary electrodes other than heater electrodes to support the heater has been used (See Patent Document 1).

CITATION LIST

Patent Literature

Patent Document 1: Japanese Unexamined Patent publication (Kokai) No. H09-263491

SUMMARY OF INVENTION

Technical Problem

However, a large amount of heat escapes from the heater through the auxiliary electrodes, and this increases power consumption of the single-crystal manufacturing apparatus. The conventional CZ and MCZ methods thus have problems of inferior heat efficiency, industrially high cost, and great environmental impact.

The present invention was accomplished in view of the above-described problems, and its object is to provide a single-crystal manufacturing apparatus that can inhibit the heater deformation and prevent deterioration of heat efficiency.

Solution to Problem

To achieve this object, the present invention provides a single-crystal manufacturing apparatus for manufacturing a single crystal ingot according to the Czochralski method comprising: a crucible that contains a raw material melt; a heater having a cylindrical heat generating portion that surrounds the crucible; a main chamber that accommodates the heater; a heater electrode that supports the heater and supplies current to the heater; and a heat insulating plate provided below the cylindrical heat generating portion of the heater, wherein the heat insulating plate is fixed to and supported by the heater electrode through an insulating stationary member, and an insulating support member is provided on an upper surface of the heat insulating plate at a position at which the insulating support member faces a lower end of the cylindrical heat generating portion.

When the heat insulating plate is fixed to and supported by the heater electrode through the insulating stationary member, and the insulating support member is provided on the upper surface of the heat insulating plate at a position at which the insulating support member faces the lower end of the cylindrical heat generating portion, the insulating support member provided on the heat insulating plate can support the cylindrical heat generating portion of the heater to inhibit the heater deformation. In addition, when the heater contacts the insulating support member, the amount of heat escaping due to the contact is small and the heat efficiency of the heater substantially does not deteriorate because the insulating support member contacting the heater is provided on the heat insulating plate that is fixed to and supported by the heater electrode through the insulating stationary member. Since the heat insulating plate contacts the heater electrode and the heater through the insulating members, there is also no risk of the electric discharge. The inhibition of the deformation of the cylindrical heat generating portion of the heater eliminates a need of an additional element such as an auxiliary electrode, and this realizes a low cost apparatus.

It is preferable that the heater is supported at two points by the heater electrode, and the insulating support member is provided on the upper surface of the heat insulating plate at one of positions rotated by an angle of 90° with respect to the two points at which the heater is supported by the heater electrode such that the insulating support member faces the lower end of the cylindrical heat generating portion.

In this single-crystal manufacturing apparatus, the insulating support member is located at the position at which the largest deformation can occur in the cylindrical heat generating portion of the heater, and the heater deformation can be thereby inhibited more effectively.

The distance between an upper end of the insulating support member and the lower end of the cylindrical heat generating portion of the heater is preferably in a range between 0 to 5 mm.

In this single-crystal manufacturing apparatus, the heater deformation can be sufficiently inhibited.

The inner diameter of the cylindrical heat generating portion of the heater is preferably 850 mm or more.

The apparatus of the present invention can inhibit the deformation without the deterioration of its heat efficiency even when a large heater having a cylindrical heat generating portion with an inner diameter of 850 mm or more is used, and is therefore suitable for manufacture of a large diameter single crystal ingot.

Advantageous Effects of Invention

As described above, the single-crystal manufacturing apparatus of the present invention can inhibit the heater deformation and substantially prevent the deterioration of its heat efficiency, thereby enabling reduction in power consumption and low-cost manufacture of a large diameter single crystal.

DESCRIPTION OF EMBODIMENTS

Hereinafter, embodiments of the single-crystal manufacturing apparatus of the present invention will be described in detail, by way of example, with reference to the figures, but the present invention is not limited to this embodiment.

Figure 2:
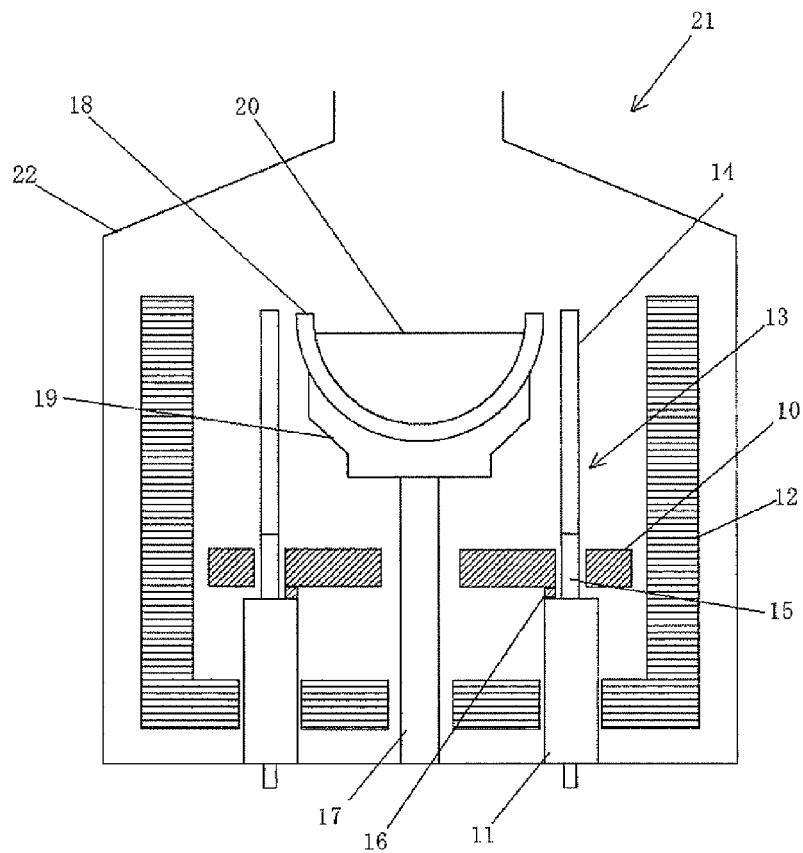
FIG. 2 is a schematic sectional view showing an embodiment of the single-crystal manufacturing apparatus of the present invention.

FIG. 2 is a schematic sectional view showing an example of the single-crystal manufacturing apparatus of the present invention. The single-crystal manufacturing apparatus 21 of the present invention shown in FIG. 2 is an apparatus that manufactures a single crystal ingot according to the Czochralski method and includes a quartz crucible 18 that contains a raw material melt 20, a graphite crucible 19 outside the quartz crucible, and a crucible support shaft 17 that supports, rotates, raises, and lowers the quartz crucible 18 and graphite crucible 19. The apparatus 21 also includes the heater 13 having the cylindrical heat generating portion 14 that surrounds the quartz crucible 18 and graphite crucible 19, the heater electrodes 11 that supports the heater 13 and supplies current to the heater 13, the main chamber 22 that accommodates the heater 13, and the heat insulating plate 10 provided below the cylindrical heat generating portion 14 of the heater 13. A heat insulating member 12 is further provided outside the heater 13 and the heat insulating plate 10 and inside the inner wall and bottom surface of the main chamber 22.

Figure 1:
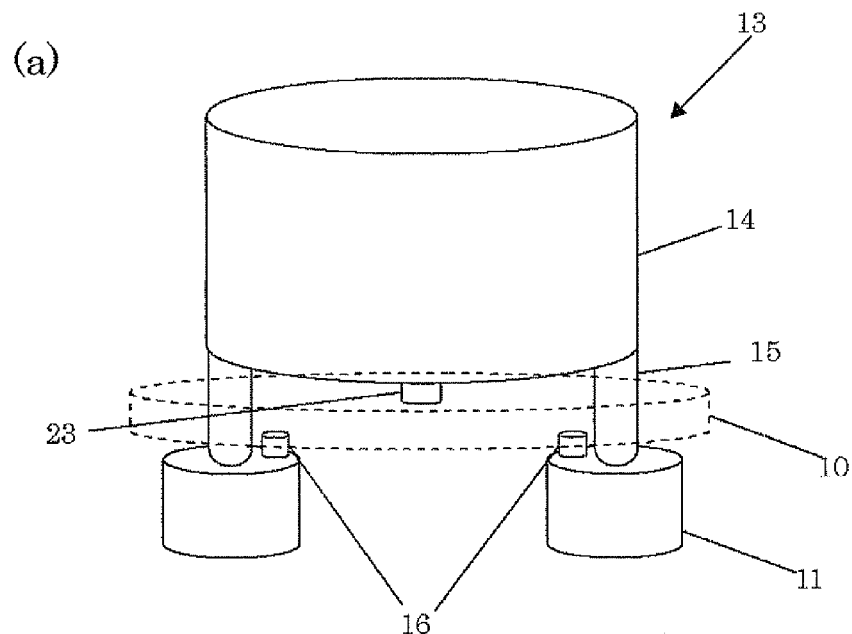
FIG. 1 partially show an embodiment of the single-crystal manufacturing apparatus of the present invention, in which (a) shows a schematic perspective view, and (b) shows a schematic side view.
Figure 1:
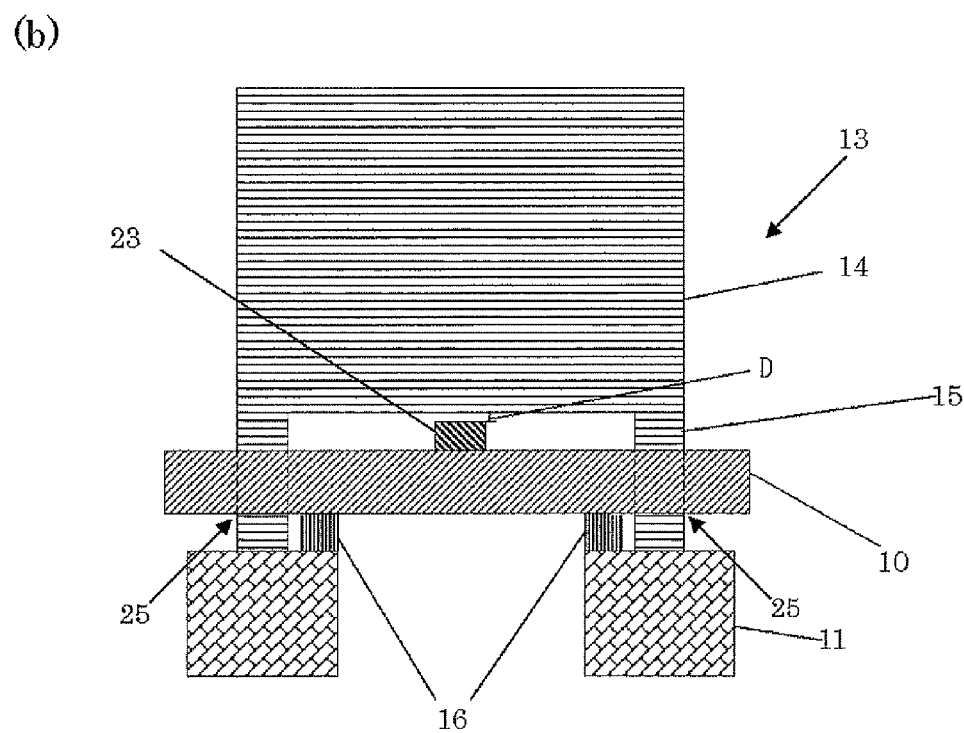

FIG. 1 partially show the example of the single-crystal manufacturing apparatus of the present invention, in which (a) shows a schematic perspective view, and (b) shows a schematic side view. In FIG. 1(a), the heat insulating plate 10 is illustrated by dotted lines. The heater 13 of the single-crystal manufacturing apparatus 21 of the present invention may be a graphite heater, for example. As shown in FIGS. 1(a) and (b), and FIG. 2, the apparatus has power supply terminals 15 at the lower portion of the cylindrical heat generating portion 14. The power supply terminals 15 and the heater electrodes 11 are each connected so that the heater 13 is supplied with current while being supported.

As shown in FIGS. 1(a) and (b), and FIG. 2, in the apparatus 21 of the present invention, the heat insulating plate 10 is fixed to and supported by the heater electrodes 11 through the insulating stationary members 16. The insulating support member 23 is provided on the upper surface of the heat insulating plate 10 at a position at which the insulating support member 23 faces the lower end of the cylindrical heat generating portion 14.

The insulating plate 10 is usually provided to retain heat in the raw material melt 20 by insulating the heat which escapes below. The apparatus 21 of the present invention can also inhibit and further prevent the deformation of the cylindrical heat generating portion 14 of the heater 13 by the insulating support member 23 provided on the heat insulating plate 10. In the apparatus, therefore, no additional component, such as the auxiliary electrode, other than the heater electrode is needed, and the deformation of the heater 13 can be thus inhibited at low cost. When the insulating support member 23 provided on the heat insulating plate 10 contacts the cylindrical heat generating portion 14, the amount of heat escaping due to heat transfer is small because the heat insulating plate 10 is supported by the heater electrodes 11 through the insulating stationary member 16. In addition, since the heat insulating plate 10 contacts the heater electrodes 11 and the heater 13 through the insulating members, the electric discharge does not occur.

Figure 4:
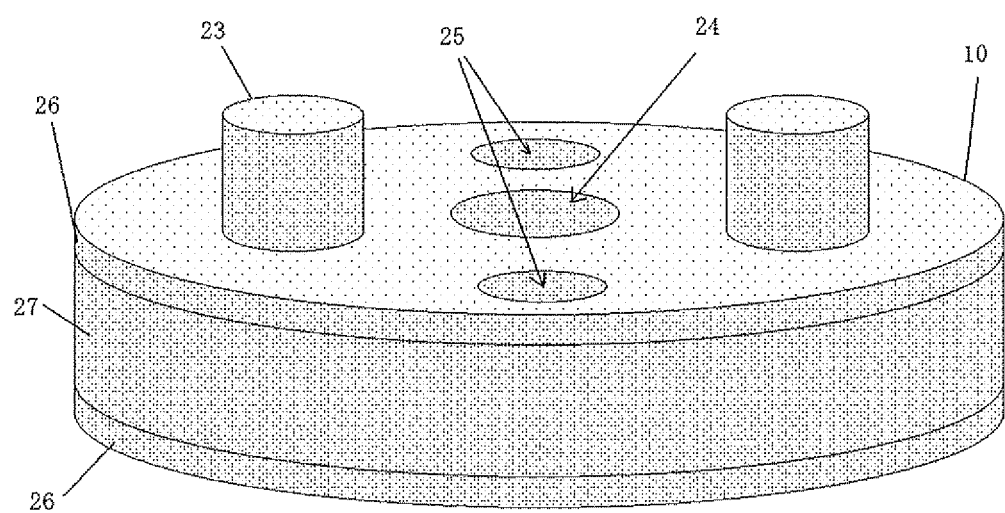
FIG. 4 is a schematic perspective view showing an exemplary heat insulating plate usable in the single-crystal manufacturing apparatus of the present invention.

FIG. 4 is a schematic perspective view showing an exemplary heat insulating plate usable in the single-crystal manufacturing apparatus of the present invention. As shown in FIG. 4, the heat insulating plate 10 may be a disk-shaped plate composed of a graphite material 26 and an insulating material 27. In this plate, a central hole 24 through which the crucible support shaft 17 passes and holes 25 through which the respective power supply terminals 15 of the heater 13 passes may be formed.

Any shape of the insulating support member 23 and insulating stationary members 16 are acceptable as long as both their end surfaces are flat. Exemplary materials of these members 23 and 16 include silicon carbide, silicon nitride, alumina, and the like.

When the heater 13 does not include the power supply terminals 15, the cylindrical heat generating portion of the heater can be directly supported by the heater electrode(s).

When the heater 13 is supported at two points by the heater electrodes 11 as shown in FIG. 1 and FIG. 2, two insulating support members 23 are preferably each provided on the upper surface of the heat insulating plate 10 at positions rotated by an angle of 90° with respect to the two points at which the heater 13 is supported by the heater electrodes 11 (i.e., positions of the holes 25) such that each of the insulating support members 23 faces the lower end of the cylindrical heat generating portion 14, as shown in FIG. 4.

In this case, the insulating support members 23 are located at positions at which the deformation of the cylindrical heat generating portion 14 of the heater 13, such as deflection, is particularly easy to occur. The lower end of the cylindrical heat generating portion 14 can be accordingly supported at a total of four positions of rotational symmetry, including the two support points of the heater electrodes 11, and the deformation of the cylindrical heat generating portion 14 can be thereby effectively inhibited. When the cylindrical heat generating portion 14 of the heater 13 has a large inner diameter, an additional insulating support member 23 can be provided to support the cylindrical heat generating portion 14 at more than two points.

As shown in FIG. 1(b), the distance 'D' between the upper end of the insulating support member 23 and the lower end of the cylindrical heat generating portion 14 of the heater 13 is preferably in the range between 0 to 5 mm.

When the insulating support member 23 is brought into contact with the lower end of the cylindrical heat generating portion 14 with the heater 13 being placed before single crystal manufacture (D=0 mm) or the distance to the lower end is within 5 mm, the deformation of the heater 13 can be surely inhibited so as to prevent the problem due to the contact with other components.

The inner diameter of the cylindrical heat generating portion 14 of the heater 13 is preferably 850 mm or more.

The above-described single-crystal manufacturing apparatus of the present invention can inhibit the deformation even when the cylindrical heat generating portion 14 has a large inner diameter of 850 mm or more. The apparatus therefore enables effective heating and cost reduction in silicon wafer production, when a large inner diameter crucible is used to manufacture a large diameter single crystal ingot.

Since the above single-crystal manufacturing apparatus of the present invention can inhibit the heater deformation without the deterioration of heat efficiency, the single-crystal manufacturing apparatus is preferably used in single crystal manufacture, for example, according to the MCZ method, in which the heater is easily deformed due to a magnetic field.

EXAMPLE

The present invention will be more specifically described below with reference to Example and Comparative Example, but the present invention is not limited to this example.

Example

A single crystal ingot was manufactured with the single-crystal manufacturing apparatus of the present invention shown in FIGS. 1, 2 and 4. In Example, the distance between the upper end of the insulating support members and the lower end of the cylindrical heat generating portion of the heater was 5 mm.

First, a polycrystalline raw material of 500 kg was charged into a quartz crucible having an inner diameter of 910 mm and melted with a graphite heater having an inner diameter of 1020 mm. A horizontal magnetic field was then applied at a center intensity of 0.4 T. Through a process for maturing the melt, a seed crystal having an orientation of <001> was dipped into the melt. At this time, the rate of Ar introduced into a furnace was adjusted to 200 L/min. The pressure in the furnace was adjusted to 100 hPa (75 Tarr) by resistance provided in an exhaust pipe.

After the seed crystal was brought into contact with the melt, the diameter of the ingot was increased to 300 mm without performing a necking process. Boron was doped to adjust the specific resistance of a constant diameter portion to be product to 10 Ω·cm and the 300-mm diameter, boron-doped silicon single crystal ingot was grown. At this time, the average power consumption was 138 kW. The measurement result is shown in FIG. 3.

Comparative Example

Figure 5:
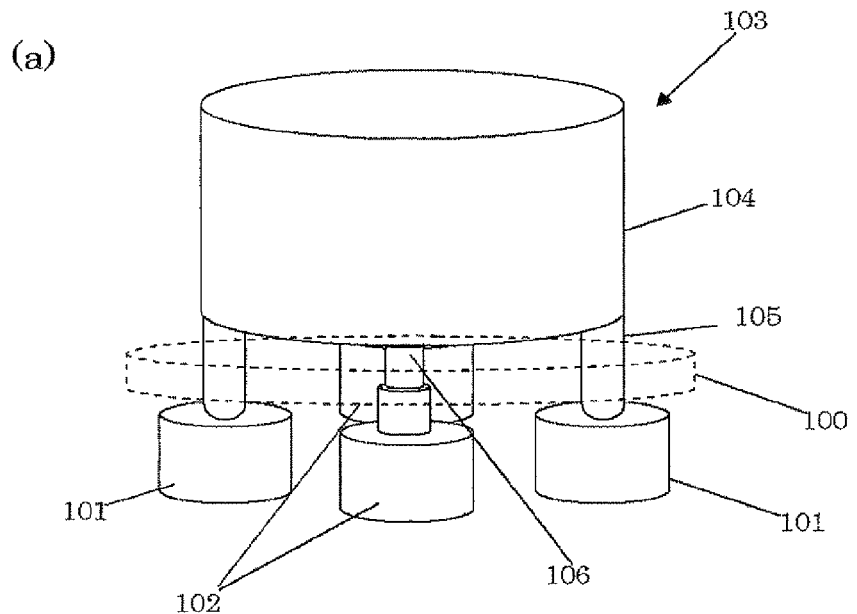
FIG. 5 partially show a conventional single-crystal manufacturing apparatus used in Comparative Example, in which (a) shows a schematic perspective view, and (b) shows a schematic side view.
Figure 5:
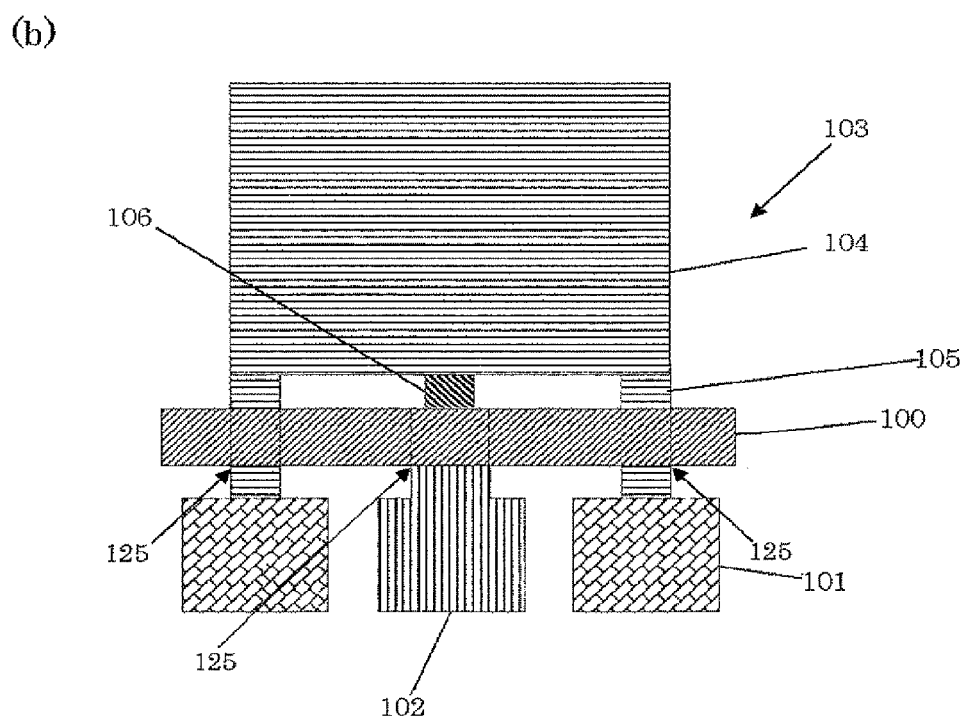

FIG. 5 partially show a conventional single-crystal manufacturing apparatus used in Comparative Example, in which (a) shows a schematic perspective view, and (b) shows a schematic side view. In the schematic perspective view of FIG. 5(a), a heat insulating plate 100 is illustrated by dotted lines. As shown in FIGS. 5(a) and (b), a heater 103 having a cylindrical heat generating portion 104 and power supply terminals 105 was supported by heater electrodes 101. The heat insulating plate 100 was provided below the cylindrical heat generating portion 104. Two heater auxiliary electrodes 102 were provided to support the heat insulating plate 100. The lower end of the cylindrical heat generating portion 104 was supported, through insulating support members 106, at two points on the heater auxiliary electrodes 102 penetrating holes 125. Except for these conditions, the same apparatus as Example was used to grow a 300-mm diameter silicon single crystal ingot under the same conditions as Example. At this time, the average power consumption was 150 kW. The measurement result is shown in FIG. 3.

Figure 3:
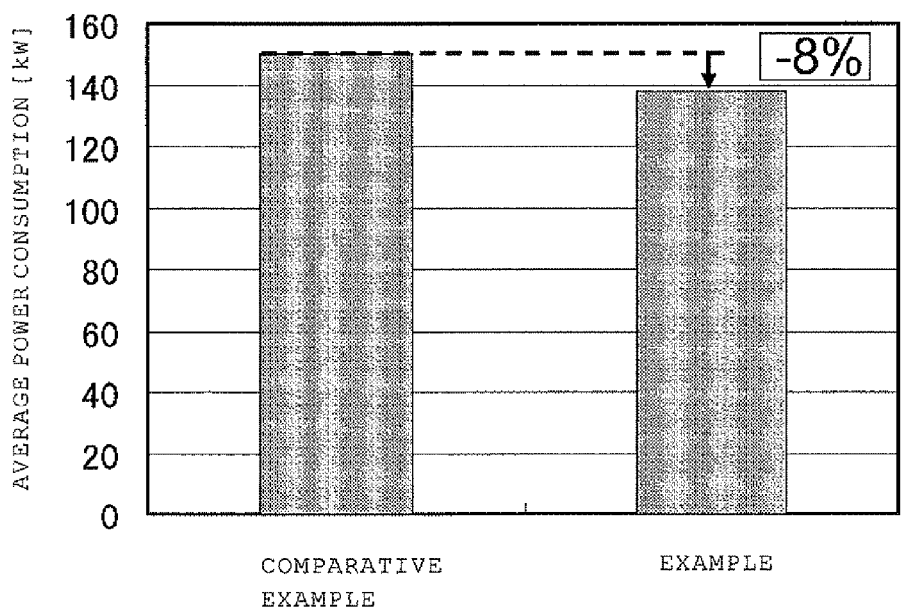
FIG. 3 is a graph showing average consumption power in each single crystal ingot manufacture of Example and Comparative Example.

As shown in FIG. 3, it was confirmed that the single-crystal manufacturing apparatus of the present invention was able to reduce power consumption by approximately 8% in the single crystal manufacture.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A single-crystal manufacturing apparatus for manufacturing a single crystal ingot according to the Czochralski method comprising:
    a crucible that contains a raw material melt;
    a heater having a cylindrical heat generating portion that surrounds the crucible;
    a main chamber that accommodates the heater;
    a heater electrode that supports the heater and supplies current to the heater; and
    a heat insulating plate provided below the cylindrical heat generating portion of the heater, wherein:
    the heat insulating plate is fixed to and supported by the heater electrode through an insulating stationary member, and an insulating support member is provided on an upper surface of the heat insulating plate at a position at which the insulating support member is oriented directly below a lower end of the cylindrical heat generating portion, so that the lower end of the cylindrical heat generating portion overlaps the insulating support member in a vertical direction,
    the heater is supported at two points by the heater electrode, and the insulating support member is provided on the upper surface of the heat insulating plate at one of positions rotated by an angle of 90° with respect to the two points at which the heater is supported by the heater electrode such that the insulating support member faces the lower end of the cylindrical heat generating portion, and
    a distance between an upper end of the insulating support member and the lower end of the cylindrical heat generating portion of the heater is in a range between 0 to 5 mm.

2. The single-crystal manufacturing apparatus according to claim 1, wherein an inner diameter of the cylindrical heat generating portion of the heater is 850 mm or more.

* * * * *